United States Patent [19]

Turner

[11] Patent Number: 4,495,732

[45] Date of Patent: Jan. 29, 1985

[54] SEMICONDUCTOR WAFER SECTIONING MACHINE

[76] Inventor: Roger S. Turner, 620 Carpenter La., Philadelphia, Pa. 19119

[21] Appl. No.: 416,975

[22] Filed: Sep. 13, 1982

[51] Int. Cl.³ .............................................. B24B 5/36
[52] U.S. Cl. .................................. 51/91 R; 51/217 R
[58] Field of Search ............... 51/217 R, 91 R, 217 S, 51/234 R; 125/13 R, 23 T; 83/752; 269/289 R, 94, 254 R, 267, 275

[56] References Cited

U.S. PATENT DOCUMENTS

| | | | |
|---|---|---|---|
| 2,165,002 | 7/1939 | Ocenasek | 83/752 |
| 3,052,461 | 9/1962 | Bateman | 269/94 |
| 3,745,716 | 7/1973 | Turner | 51/217 S |
| 4,056,136 | 11/1977 | Miller | 269/289 R |
| 4,306,731 | 12/1981 | Shaw | 269/254 R |

Primary Examiner—James G. Smith
Assistant Examiner—Matthew D. Daschel
Attorney, Agent, or Firm—John B. Sowell

[57] ABSTRACT

A wafer holding chuck for a wafer sectioning machine is provided with a substantially flat chuck plate having an extremely flat resilient strip support for supporting only a very small area of the wafer above the surface of the chuck plate at a point opposite the rotating abrasive tool. The pressure of the highly accurate rotating abrasive tool engages the front surface of the wafer to be sectioned and the resilient strip support conforms to the rear surface of the wafer causing the abrasive tool to make uniform contact with the front surface of the wafer being sectioned so that the section cut in the wafer is extremely uniform.

10 Claims, 11 Drawing Figures

SEMICONDUCTOR WAFER SECTIONING MACHINE

BACKGROUND OF THE INVENTION

1. Field of the Invention

This invention relates to the measurement of the thickness and uniformity of the layers of a semiconductor wafer employing a sectioning machine. More particularly, the present invention relates to an improved wafer chuck for holding large wafers for engagement with a rotatable abrasive tool of a sectioning machine.

2. Description of the Prior Art

A major portion of the semiconductor industry is concerned with the manufacture of integrated circuits. Integrated circuits are becoming more dense and a large number of devices are being placed on a single wafer which decreases the cost of manufacture and effectively decreases the power requirements for the individual devices. These more complicated and highly miniaturized devices require precise control of the thickness and uniformity of the layers of material deposited on the substrate wafer to make the semiconductor chips. During various stages of production of these integrated circuit devices it has become necessary to measure the thicknesses of the layers employing sectioning machines.

Early prior art sectioning machines employed a machine tool approach. The semiconductor wafer was clamped onto a rigid flat plate leaving the top surface of the semiconductor wafer exposed. A rotatable abrasive tool was engaged against the top surface of the semiconductor wafer to form a groove therein. It was found that the top of the semiconductor wafer did not uniformly engage the abrasive tool along a line because contaminates such as particles of dirt would get between the back of the wafer and the mounting plate and/or the semiconductor wafer was not uniformly thick or flat so as to cause the top surface of the semiconductor wafer to be out of parallel alignment with the abrasive tool.

My U.S. Pat. No. 3,745,716 issued July 17, 1973 discloses a sectioning machine in which a semiconductor wafer is mounted in a mechanical wafer chuck. The wafer chuck is provided with flat jaw reference surfaces which engage the front polished surface of the wafer. A force is applied to the rear of the semiconductor wafer to force the front face of the wafer into flat engagement with the jaw reference surface. It was found that the wafer chuck of this sectioning machine was expensive to manufacture since the jaw reference surfaces were ground and precision finished from a block of stainless steel. When the semiconductor wafer is engaged with the jaw reference surfaces the wafer becomes part of the rigid wafer chuck and precise alignment of the chuck relative to the rotational axis of the abrasive tool is required. Such precise alignment is difficult and expensive to provide.

The state of the semiconductor wafer art has been advanced to a point where much larger diameter semiconductor wafers are being used. These larger wafers are more uniform in thickness and flatness than smaller wafers produced in the prior art. These larger wafers require much larger chucks. When the larger wafers are mounted on larger chucks it is desirable to either improve the accuracy or maintain the accuracy of the sectioning machines used heretofore. Since the diameter of the wafer being sectioned is much larger, the wafer chuck which holds the semiconductor wafer would be expected to be heavier and more rugged to achieve greater stability and accuracy over a greater distance. It was found that the wafer chucks heretofore used with sectioning machines for smaller wafers were excessively expensive to manufacture for use with larger semiconductor wafers.

It would be desirable to provide a wafer chuck for a sectioning machine which is less expensive to manufacture than wafer chucks known heretofore and which provides extremely precise line sections when employed for use with either large or small semiconductor wafers.

SUMMARY OF THE INVENTION

It is a principal object of the present invention to provide a novel semiconductor wafer chuck for a sectioning machine.

It is another principal object of the present invention to provide a low mass semiconductor wafer chuck for a sectioning machine which lessens the tendency to generate vibration forces which could cause the semiconductor wafer to flex while engaging the rotary abrasive tool thus causing inaccurate groove shapes and/or permanent damage to a delicate semiconductor wafer.

It is another object of the present invention to provide a novel wafer chuck for holding larger wafers, small wafers or parts of wafers.

It is another object of the present invention to provide a novel semiconductor wafer chuck for a sectioning machine which is inexpensive to manufacture and is easy to adjust for producing accurate groove shapes.

It is yet another object of the present invention to provide a novel wafer chuck which is adapted to be employed in existing sectioning machines.

According to these and other objects of the present invention, there is provided a sectioning machine of the type having a rotary abrasive tool mounted on a housing and having a semiconductor wafer holding chuck adapted to engage a wafer in uniform contact with the abrasive tool. The novel semiconductor wafer holding chuck is mounted on the housing and adapted to be moved to engage a semiconductor wafer mounted thereon with the abrasive tool. The semiconductor wafer holding chuck comprises a substantially flat chuck plate having a front face juxtaposed the rotary abrasive tool and is adapted to support the wafer to be sectioned thereon. Instead of mounting the bottom face of the semiconductor wafer on the flat chuck plate there is provided resilient strip means on the front face of the chuck plate which are aligned parallel to the rotational axis of the rotary abrasive tool. Fastening means are provided on the wafer chuck for holding the semiconductor wafer for engagement with the resilient strip means. When the semiconductor wafer is engaged with the rotary abrasive tool the resilient strip means are compressed to permit the front face of the wafer to conform to the rotary abrasive tool and make uniform contact therewith.

DESCRIPTION OF THE PREFERRED EMBODIMENTS

This invention is directed to a semiconductor wafer sectioning machine and to a novel wafer chuck for holding a wafer to be sectioned by a rotating abrasive tool on a sectioning machine. The line or groove width formed by the abrasive tool is measured with a microscope and the depth of the line or groove is calculated. Precision sectioning machines of the type described herein are capable of measuring layer depths in the material being sectioned in the range of one-tenth of one micron and thicker. Wafer sectioning machines are being used to measure layer depths on objects other than semiconductor wafers. For example, plated layers, oxide layers, vacuum deposited layers, etc. on all types of materials that have thin layers to be measured. Accordingly, the term wafer as used herein shall mean any base material or substrate on which layers to be measured have been formed or deposited.

Figure 1:
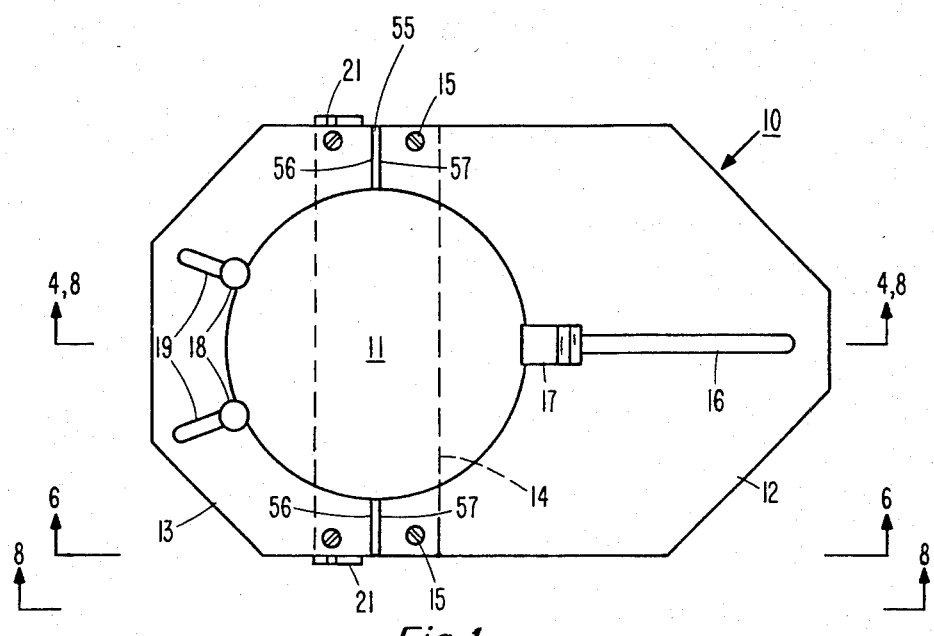
FIG. 1 is a top view of the preferred embodiment semiconductor wafer chuck.

Refer now to FIG. 1 showing a disk shaped wafer 11 being held on the top surface of a wafer holding chuck 10. Chuck 10 comprises two flat plates 12 and 13 rigidly connected to bridge member 14 by screws 15. Upper plate 12 is provided with an elongated slot 16 in which sliding clamp 17 is mounted. Adjustable clamps 18 are slidably mounted in elongated slots 19 and are independently adjustable to engage the edge of wafer 11. As will be explained in greater detail hereinafter, the clamps 17 and 18 both apply a holding force directed toward the center of the wafer 11 and may also apply a downward force at the edge of the wafer 11.

Figure 2:
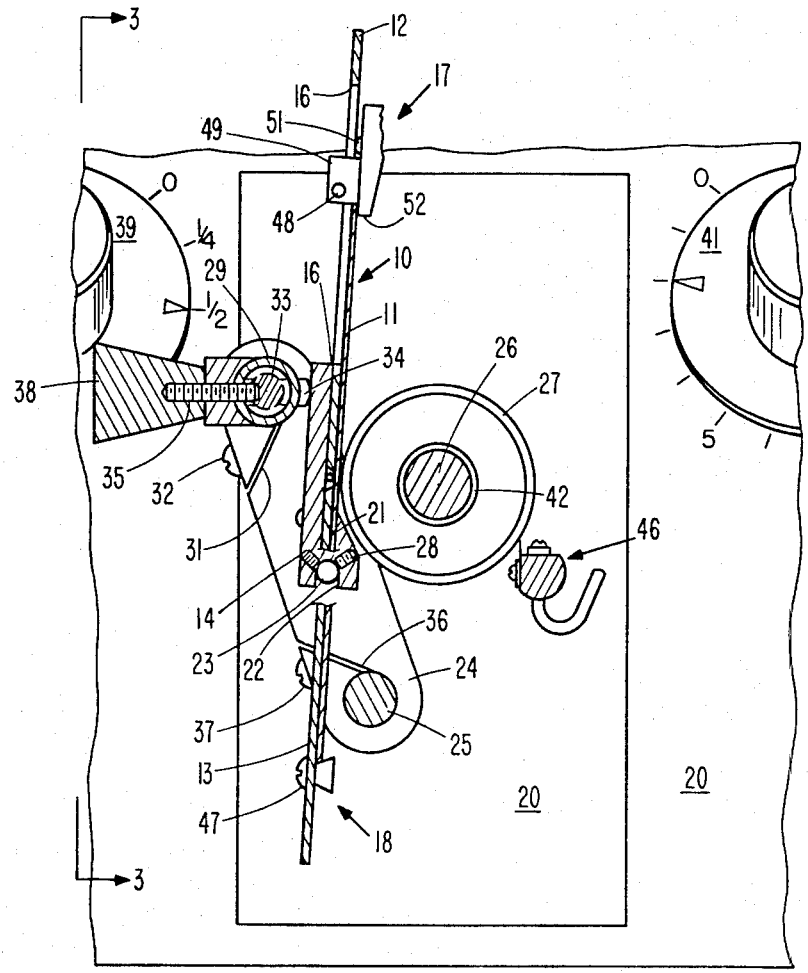
FIG. 2 is a front elevation in section of a prior art sectioning machine showing how the present invention semiconductor wafer chuck may be mounted opposite the cylindrical rotary abrasive tool.
Figure 3:
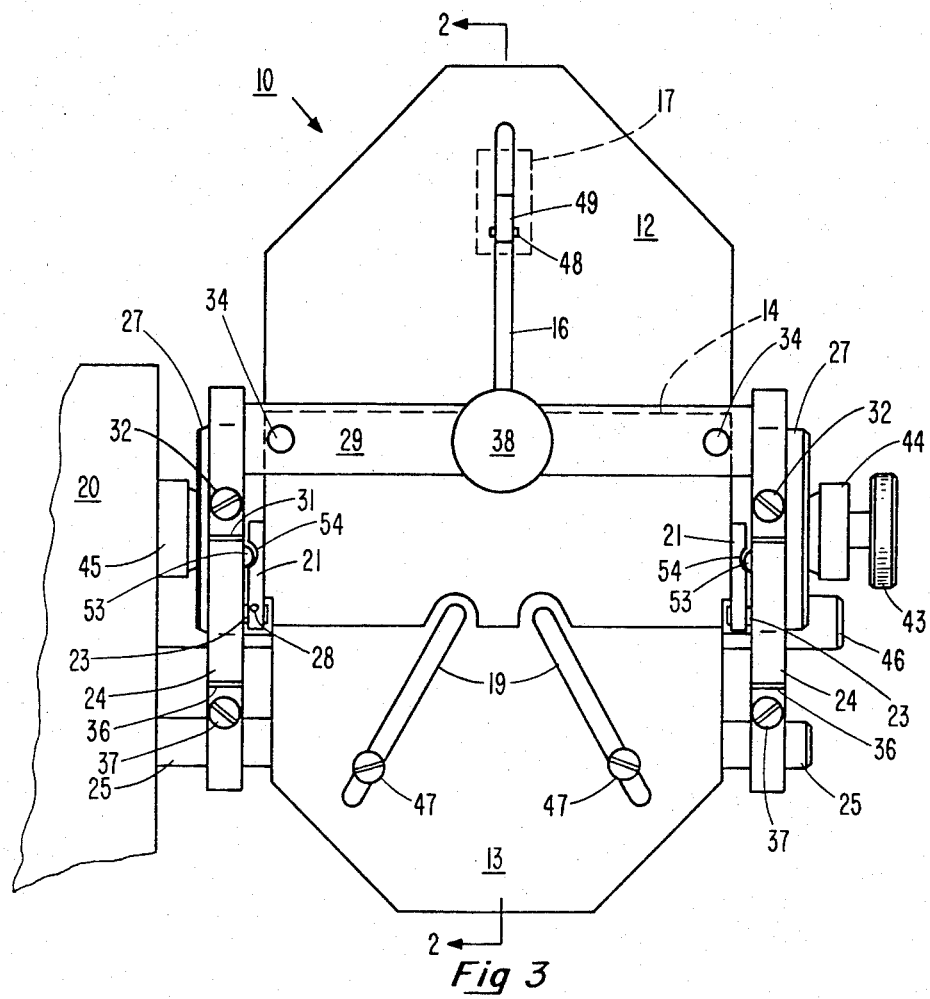
FIG. 3 is a section in elevation of the chuck of FIG. 1 taken at lines 3—3 of FIG. 2.

Refer to FIGS. 2 and 3. FIG. 2 shows wafer chuck 10 in sectional elevation view mounted on the sectioning machine 20. Chuck support brackets 21 are provided on both sides of bridge member 14. Brackets 21 having yokes 22 cooperate with and mount on support pins 23 fixed on pin support arms 24. Pin support arms 24 are pivotly mounted on chuck support shaft 25 which is movable. The front faces of flat plates 12 and 13 are aligned parallel to the center axis 26 of the cylindrical abrasive tool 27. Bridge member 14 which supports plates 12 and 13 is flat and rigid. To assure that wafer 11 engages the surface of the cylindrical tool 27 on a uniform tangent line, one of the yokes 22 in brackets 21 is made adjustable such as by providing a set screw 28.

A uniform force is applied to the back of the bridge member 14. Tubular member 29 is rigidly connected to arms 24 and held by split clamp 31 and clamp screws 32. An equalizer shaft 33 in tubular member 29 engages two push pins 34 mounted through loose apertures at the ends of the tubular member 29. Threaded pin 35 is threaded through shaft 29 and engages the center of equalizer shaft 33. A predetermined torsional force is applied through shaft 25 and imparted to arms 24. Arms 24 are fixed on shaft 25 by split clamp 36 and screws 37 and transmit the torsional force into tubular member 29. This force is imparted by threaded pin 35 to the equalizer shaft 33 which is free to swivel and apply equal forces to the push pins 34. Knob 38, attached to pin 35, is provided for the initial manual positioning of the arms 24. Dial 39 is provided for setting the aforementioned torsional force in shaft 25 as was shown and described in my U.S. Pat. No. 3,745,716. Timer dial 41, also explained in my patent is employed to set the time that the force is applied by pins 33 and the shaft 25 to the bridge member 14.

Abrasive cylindrical tool 27 is held on shaft 42 by thumb screw 43 and adapters 44 and 45 at opposite ends. Wetting means 46 are mounted on the sectioning machine 20 and provide a means for maintaining the surface of abrasive tool 27 wet during machining.

Adjustable clamps 18 are best shown in FIG. 2. Conical shaped clamps 18 are preferably made of a rigid plastic material to prevent damage to wafer 11 and are held in slots 19 by screws 47.

Slider clamp 17 is best shown in FIGS. 2 and 3 and comprises a molded plastic member held to plate 12 by pin 48 which extends through the tongue 49. A spring bias member 51 in clamp 17 urges the clamping end 52 of clamp 17 to clamp and hold wafer 11.

Spring bias ball members 53 in the support arms 24 engage into cam grooves 54 in chuck support bracket 21 to bias the bridge member 14 into engagement with push pins 34. The spring bias ball members 53 also provide a bias force which urges yoke 22 in chuck support bracket 21 into engagement with support pins 23 to provide a holding action.

Figures 4, 5:
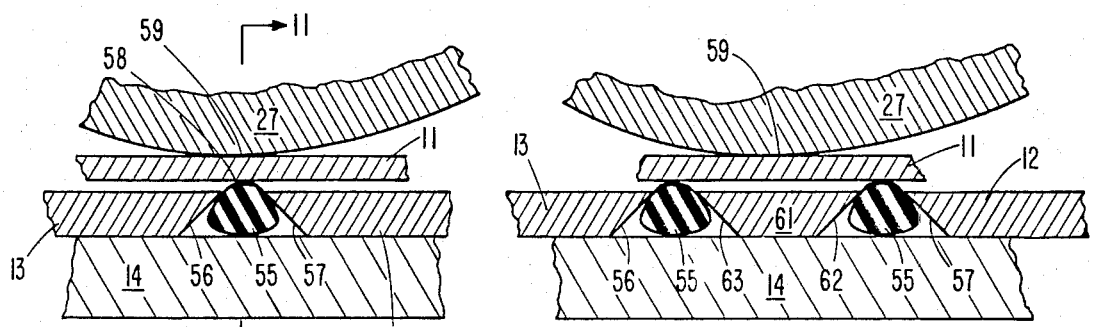
FIG. 4 is an enlarged section in elevation of a portion of the semiconductor wafer chuck shown in FIGS. 1 to 3.
FIG. 5 is an enlarged section in elevation of a portion of a modified semiconductor wafer chuck similar to FIG. 4.
Figure 11:
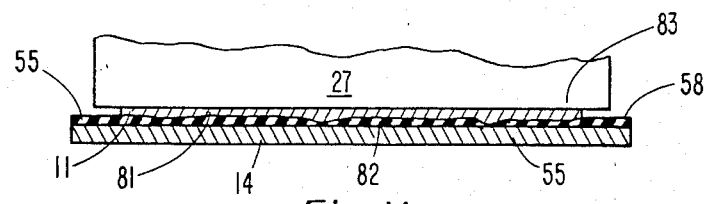
FIG. 11 is an enlarged section in elevation taken at lines 11—11 of FIG. 4 which illustrates the mode of operation of the present invention.

Refer now to FIG. 4 which is a section in elevation taken at the center of lines 4—4 in FIG. 1 through plates 12 and 13. Plates 12 and 13 are shown supported by bridge member 14 which is provided with a resilient member 55. The resilient member 55 is preferably highly compressible material such as latex rubber or silicon rubber and extends above the clamp grooves 56 and 57 to support the wafer 11 above the top surface of the plates 12 and 13 while it is engaging the abrasive tool 27. The resilient member 55 extends entirely across the grooves 56 and 57 shown also in FIG. 1. The top of the resilient member 55 is preferably made having an extremely flat and uniform surface. If the top surface 58 is not flat when mounted in grooves 56 and 57 it may be machined to provide an extremely flat surface. The cylindrical abrasive tool 27 engages the wafer 11 at a point 59 directly above the top surface 58 of the resilient means 55. When the resilient means 55 engages the back of wafer 11 it causes a uniform pressure along the tangent point on line 59 so that the cutting action by the abrasive tool 27 is uniform along line 59 (as best seen in FIG. 11).

Refer now to FIG. 5 showing an enlarged section in elevation of a modified chuck similar to FIG. 4. Flat plates 12 and 13 are mounted on bridge member 14 in a slightly spaced apart relationship to permit a center clamp plate 61 to be mounted therebetween. Clamp plate 61 is provided with clamping grooves 62 and 63 which cooperate with clamping grooves 56 and 57 on plates 13 and 14. Resilient means 55 now comprises two separate and independent resilient members similar to resilient member 55 provided in the FIG. 4 embodiment. The top surface of the resilient members 55 in FIG. 5 also engage the back surface of wafer 11 to form a uniform line contact therewith which together cooperate with the cylindrical abrasive tool 27 to engage the abrasive tool along the forementioned tangent line 59. Both FIG. 4 and FIG. 5 comprise preferred embodiments. FIG. 5 has an averaging affect in supporting the rear face of wafer 11.

Figure 6:
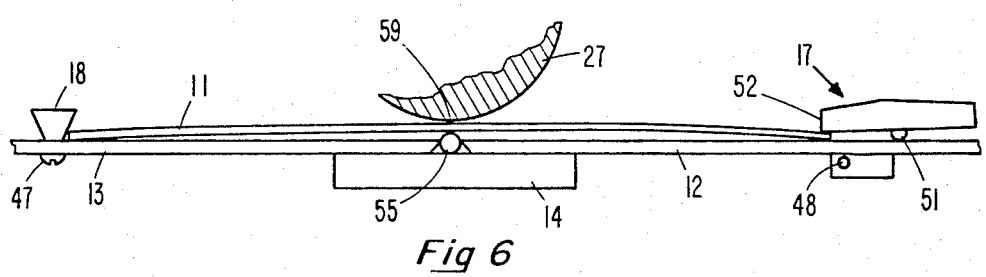
FIG. 6 is an enlarged section in elevation showing a preferred embodiment fastening means.
Figure 7:
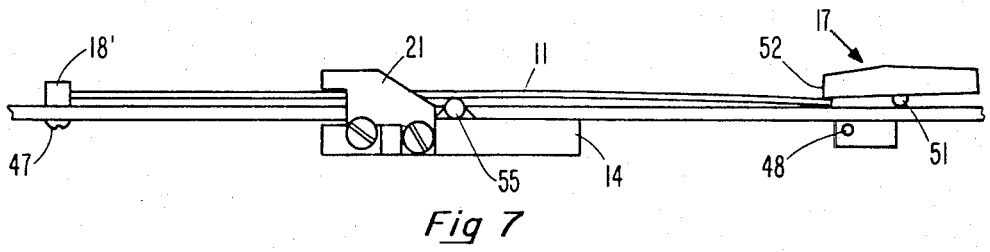
FIG. 7 is an enlarged section in elevation showing a modified embodiment fastening means.

Refer now to FIGS. 6 and 7 showing a complete wafer mounted on a chuck 10 of the type shown in FIGS. 1 to 3. In FIG. 6 the wafer 11 is shown being held in engagement with the front face of plate 13 by adjustable clamp 18. The wafer 11 will be understood to be very thin and may be bent. Thus the illustration showing the wafer 11 being supported above the surface of plates 12 and 13 by resilient means 55 may only be approximately 0.005 of an inch and is exaggerated in order to illustrate the bending of the wafer 11. The opposite end of wafer 11 is shown held by slider clamp 17 having its clamping end 52 spring bias by member 51 and pivoted on pin 48. FIG. 7 is identical to FIG. 6 with all respect except that adjustable clamp 18 which was conical in shape has been replaced with a cylindrical post 18' which is preferably made from a plastic material which will not change the wafer 11. In this embodiment, the wafer is assumed to be substantially flat and does not require the enhanced effect of bending the wafer over the resilient means 55 to assure that the tangent line 59 becomes flatter.

Figure 8:
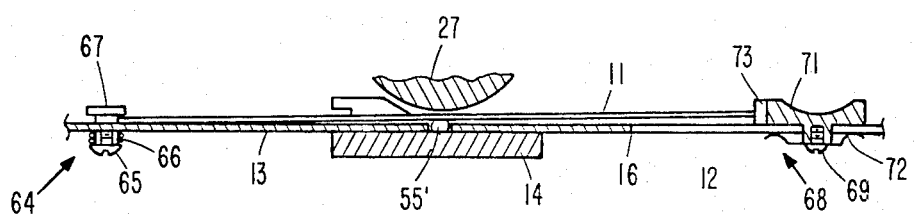
FIG. 8 is an enlarged section in elevation showing another modified fastening means and a modified resilient strip means.

Refer now to FIG. 8 which is an enlarged section in elevation taken at the front of the chuck 10 and showing modified clamping means and modified resilient means. The adjustable clamp 18 is replaced with a spring bias clamp 64 which comprises a screw 65 engaged in the button 67 and biased by spring 66 against the back of the flat plate 13. The sliding clamp 17 has been replaced by modified sliding clamp 68 which comprises a screw 69 holding the molded plastic clamp 71 in the groove 16 by means of spring 72. Molded plastic clamp 71 is provided with a soft and resilient face 73 which engages the edge of the wafer 11 and does not press it downward against the face of the flat plate 12. The modified resilient means 55' is shown having a square or rectangular shape and is spaced away from the edges of the plates 12 and 13 to permit clearance during compression of the resilient means 55'.

Figure 9:
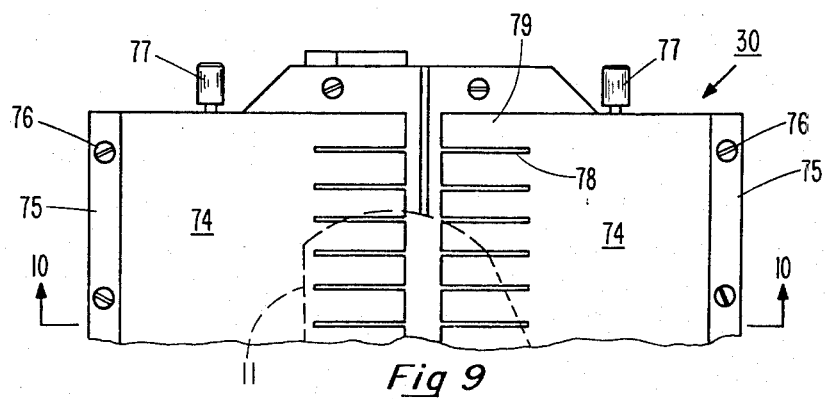
FIG. 9 is a partial plan view of a modified wafer chuck adapted to hold wafers or parts of wafers.
Figure 10:
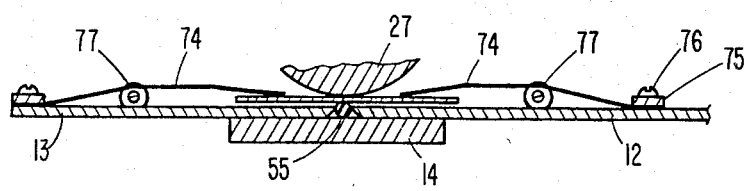
FIG. 10 is a section in elevation of the wafer chuck of FIG. 9.

Refer to FIG. 9 and to FIG. 10 showing a section in elevation of the modified chuck 30 of FIG. 9 taken at lines 10—10 in FIG. 9. The plates 12 and 13 are supported by the bridge member 14 having resilient means 55 interposed therebetween. Spring members 74 are preformed to provide a downward bias against the wafer or part of wafer 11 and are mounted on the flat plates 12 and 13 by clamp strips 75 and screws 76. In order to place a wafer on the resilient means 55, roller cams 77 are provided which may be manually moved toward the clamp strips to raise the spring members 74. The spring members are provided with slotted grooves 78 to form fingers 79 at the clamping edges of the spring member 74. It will be appreciated that when the wafer or part of a wafer 11 is placed in the chuck 30 that the chuck is not adjacent to the abrasive tool 27. While FIGS. 9 and 10 represent a modified embodiment it is appreciated that it will handle small parts of a wafer, however, the spring fingers 79 will engage the top or active surface of the wafer being sectioned.

Refer now to FIG. 11 which is a section taken through any of the aforementioned resilient means 55 or 55'. The top surface 58 of resilient means 55 is extremely flat and accurate and is supported by the support member 14 described hereinbefore. The back face 81 of a wafer 11 is shown having an irregular surface. While the irregular surface 81 is exaggerated to better explain the enhancement of the present invention it will be understood that in the prior art even dust particles which were trapped under the wafer in some instances caused irregular groove depth. Dust particles and other particles may be forty microns in diameter or larger. The accuracy to which the groove depth is being sectioned may be a fraction of a micron. In the prior art environment it was near impossible to maintain the proper cleanliness to assure that the groove depth would be uniform. Employing the present invention resilient strip 55 the rear surface 81 of the wafer 11 may be irregular as well as contaminated and the novel chuck will facilitate conformity of the support to provide a uniform groove with maximum accuracy. When irregularities and dust particles occur at the rear surface 81 of the wafer 11 they will be pressed into the resilient means so that a uniform pressure is applied to the rear surface of the wafer 11 even though there are irregularities. Any irregularities which occur between the wafer 11 and the resilient means 55 at the interface 82 are neutralized or are virtually eliminated so as to assure uniform contact of the front face 83 of the wafer 11 against the abrasive tool 27.

Having explained a preferred embodiment single strip resilient means 55 and a modified dual resilient strip means 55 it will be understood that the support of the rear surface 81 of the wafer 11 is made compliant so as to eliminate the problems which existed with contamination and irregularities in the prior art wafer holding chucks and sectioning machines. Even though resilient pads having large areas had been employed to support the back surface area 81 of a wafer, it was found that the large resilient surface of the pad was not capable of conforming to the irregular surface 81. When contaminated surfaces build up on the pads their surface was not as flat as the rear surface 81 of a wafer. Accordingly, the top surface 58 of the resilient means 55 must present a very small and thin line or area which contacts the rear surface 81 of the irregular wafer 11. In this manner the small area of contact provides a higher degree of resilience and permits the top surface 58 to easily conform with the irregularity on the rear surface 81 of the wafer 11 when a force is applied by abrasive tool 27. Accordingly, it has been found that the surface 58 of the resilient means 55 is preferably rounded or made convex rather than being made completely flat.

I claim:

1. In a sectioning machine of the type having an abrasive tool rotatably mounted on a housing and having a wafer holding chuck adapted to engage a wafer in uniform line contact with said abrasive tool comprising:
   a fixed housing,
   an abrasive tool rotatable mounted on said housing,
   a wafer holding chuck mounted on said housing and adapted to be moved to engage said wafer with said abrasive tool, said wafer holding chuck comprising, a substantially flat chuck plate having a front face juxtaposed said abrasive tool and adapted to support a wafer to be sectioned thereon, resilient strip means on said front face of said chuck plate parallel to the rotational axis of said abrasive tool and adapted to engage and movably support the rear surface of a wafer thereon which is spaced apart from and adjacent to said front face of said chuck plate, edge fastening means for positioning and holding said wafer into engagement with said resilient strip means, and upon engagement of said abrasive tool against said wafer, said wafer supporting resilient strip means compresses and permits the front face of said wafer to conform and self align to and to make uniform line contact with said abrasive tool.

2. In a sectioning machine as set forth in claim 1 wherein said fastening means are adapted to engage the edges of said wafers.

3. In a sectioning machine as set forth in claim 2 wherein said fastening means comprise a plurality of inclined surfaces movably mounted on the front face of said flat chuck plate and adapted to urge said wafer toward said chuck plate.

4. In a sectioning machine as set forth in claim 1 wherein said fastening means comprise a plurality of spring fingers adapted to engage and clamp the top surface of said wafer being sectioned.

5. In a sectioning machine as set forth in claim 4 wherein said spring finger comprises slotted fingers extending from a spring plate.

6. In a sectioning machine as set forth in claim 1 wherein said fastening means are adapted to cooperate with said resilient strip means and to permit a flexible wafer to flex when clamped and when engaged against said abrasive tool and to conform to said abrasive tool in uniform line contact.

7. In a sectioning machine as set forth in claim 1 wherein said resilient strip means comprise a pair of strips of compressible material adapted to exert uniform force along two lines parallel to said uniform line contact of said wafer with said abrasive tool.

8. In a sectioning machine as set forth in claim 7 wherein said pair of compressible strips provide two substantial uniform lines of contact with the rear surface of said wafer before it engages said abrasive tool and provide additional conformable surface area contact after engagement with said abrasive tool.

9. In a sectioning machine as set forth in claim 1 wherein said resilient strip means are shaped to provide a convex surface for engagement with the rear surface of said wafer.

10. In a sectioning machine as set forth in claim 3 wherein said fastening means comprises a clamping device having an inclined face and a clamp fastener extending through said chuck plate in converging slots in said chuck plate for movably mounting said wafer on said chuck plate.

* * * * *